United States Patent [19]
Yotsumoto et al.

[11] Patent Number: 6,123,120
[45] Date of Patent: Sep. 26, 2000

[54] CLEAN STORAGE EQUIPMENT FOR SUBSTRATES AND METHOD OF STORING SUBSTRATES

[75] Inventors: Tadashi Yotsumoto; Terumi Muguruma; Noriaki Yoshikawa; Yuichi Kuroda, all of Tokyo, Japan

[73] Assignee: Kabushiki Kaisha Toshiba, Kawasaki, Japan

[21] Appl. No.: 09/203,491

[22] Filed: Dec. 2, 1998

[30] Foreign Application Priority Data

Dec. 3, 1997 [JP] Japan ..................................... 9-333229

[51] Int. Cl.[7] ...................................................... B65B 1/04

[52] U.S. Cl. ................. 141/65; 141/59; 141/98; 414/217

[58] Field of Search ................................. 141/63, 65, 66, 141/98, 59, 192, 198; 414/217, 221, 292; 206/710–712

[56] References Cited

U.S. PATENT DOCUMENTS

| | | | |
|---|---|---|---|
| 5,378,283 | 1/1995 | Ushikawa | 414/217 |
| 5,806,574 | 9/1998 | Yamashita et al. | 141/63 |
| 5,879,458 | 3/1999 | Roberson, Jr. et al. | 414/217 |

*Primary Examiner*—Steven O. Douglas
*Attorney, Agent, or Firm*—Oblon, Spivak, McClelland, Maier & Neustadt, P.C.

[57] ABSTRACT

Storage equipment simply and effectively maintains the cleanness of substrates stored therein. The substrates in the storage equipment are set in a pod. The storage equipment has removable covers, a unit for fitting the covers to pods, respectively, a unit for holding the pods with the covers, a gas supply unit for individually supplying gas into the pods through the covers, and an exhaust unit for individually discharging an atmosphere from the pods through the covers. Each pod is closed with the cover in the storage equipment, and the gas supply unit and exhaust unit periodically replace an atmosphere in each pod with inert gas or evacuate each pod, to control the storage conditions of each pod in the storage equipment.

28 Claims, 13 Drawing Sheets

CLEAN STORAGE EQUIPMENT FOR SUBSTRATES AND METHOD OF STORING SUBSTRATES

BACKGROUND OF THE INVENTION

1. Field of the Invention

The present invention relates to clean storage equipment for substrates and a method of storing substrates. In particular, the present invention relates to clean storage equipment for storing large substrates including semiconductor and glass substrates and a method of storing such substrates.

2. Description of the Prior Art

To make highly integrated fine devices from substrates or wafers, the surfaces thereof must not be contaminated with dust and atmospheric gas during manufacturing and storing stages.

In a cassette-to-cassette system, silicon wafers are stored in cassettes serving as carriers during a manufacturing stage. Each cassette holds 13 or 25 wafers and is set in and removed from a manufacturing apparatus such as a film forming apparatus and an etching apparatus. The cassettes with wafers used through the manufacturing stage are stored as they are in storage equipment.

The storage equipment may be a hermetic carrier box or a clean stocker.

The carrier box receives at least one cassette with wafers. The carrier box is kept in a clean room and is transported from a location to another as and when required. The carrier box is closed to prevent dust from contaminating the wafers.

The clean stocker generates dust-free airflow. FIG. 13A is a perspective view showing the inside of a clean stocker according to a prior art.

The stocker has a cassette transfer tool 505 that longitudinally travels. Many shelves 501 are arranged on each side of the cassette transfer tool 505.

A wafer cassette 502 holds wafers 503 and is inserted into an entrance 506. The cassette 502 is placed on the shelf 501 by the cassette transfer tool 505. To take the cassette 502 out of the stocker, the cassette transfer tool 505 moves the cassette 502 from the shelf 501 to an exit 507. The entrance 506 and exit 507 are each open, and the pressure of airflow from the inside of the stocker blocks outside air from entering the stocker.

FIG. 13B is a sectional view showing the stocker. Arrow marks indicate airflow in the stocker. The airflow is generated by fans 508 arranged under the shelves 501 and is passed through ducts 509, filters 510, shelves 501, and cassettes 502 toward the center of the stocker. From there, the airflow goes downwardly, is passed through filters 504, and is drawn by the fans 508, which again generates the airflow toward the ducts 509. In this way, the stocker circulates air to remove dust through the filters 510 and 504, thereby making clean air.

Generally, the wafer cassette 502 holds 13 or 25 wafers of 200 mm diameter, and the stocker stores 100 to 200 cassettes 502.

The carrier box mentioned first is easy to handle. The carrier box, however, usually has insufficient airtightness to allow outside air to enter as time passes. Then, wafers in the carrier box will be contaminated with water and impurity gas such as oxygen contained in the outside air.

On the other hand, the clean stocker may continuously drive the fans 508 to always circulate clean air through the stocker to prevent outside dust and impurity gas from entering the stocker. Even clean airflow, however, causes dust in the stocker if the airflow becomes turbulent. The turbulent airflow causes dust to dwell to make the filters 504 and 510 hardly remove the dust.

Accordingly, airflow around wafers in the stocker must be laminar. The movement of the cassette transfer tool 505, however, disturbs airflow in the stocker. To avoid this, the stocker must be large.

If the fans 508 stop due to power failure, outside air enters the stocker to deteriorate the cleanness of the stocker. To prevent this, the stocker must have an emergency power source. This increases the designing and manufacturing time and cost of the stocker.

SUMMARY OF THE INVENTION

An object of the present invention is to provide equipment for and a method of simply and effectively storing substrates and keeping cleanness of the substrates.

In order to accomplish the objects, an aspect of the present invention provides storage equipment for substrates set in pods. The equipment has covers for the pods, a unit for fitting the covers to the pods, respectively, a unit for holding the pods with the covers, a gas supply unit for individually supplying gas into the pods through the covers, and an exhaust unit for individually discharging an atmosphere from the pods through the covers.

The pods are hermetically closed with the covers. The gas supply unit and exhaust unit handle the pods individually to replace an atmosphere in each pod with inert gas, thereby controlling the storage conditions of substrates in each pod. Compared with controlling the storage conditions of the storage equipment as a whole, controlling the storage conditions of each pod is easier and simpler to achieve.

Pods that are used to carry substrates through a processing stage are stored as they are in the storage equipment. Namely, it is not necessary to specially prepare chambers for substrates in the storage equipment. This simplifies the structure of the storage equipment.

The gas supply unit may have a gas source, piping for connecting the gas source to the covers, and gas supply valves arranged for the pods, respectively, in the piping. The exhaust unit may have an exhaust port connected to the covers and exhaust valves arranged for the covers, respectively, between the covers and the exhaust port.

The exhaust unit may be a vacuum unit to individually evacuate the pods through the covers.

The vacuum unit surely reduces the concentration of impurity gas in each pod to prepare optimum storage conditions for each pod. Compared with evacuating the storage equipment as a whole, evacuating each pod requires a smaller vacuum pump because each pod has a small volume. This reduces the cost of the storage equipment.

The vacuum unit may consist of the vacuum pump, piping for connecting the vacuum pump to the covers, and exhaust valves arranged for the pods, respectively, in the piping.

Another aspect of the present invention provides storage equipment for substrates set in carrier cassettes. The storage equipment has storage chambers for storing the carrier cassettes, a unit for individually opening and closing the storage chambers to take in and out the carrier cassettes, a gas supply unit for individually supplying gas into the storage chambers, and an exhaust unit for individually discharging an atmosphere from the storage chambers.

This aspect of the present invention stores substrates set in carrier cassettes in the storage chambers and individually closes the storage chambers. The gas supply unit and exhaust unit handle the storage chambers individually when controlling the storage conditions thereof Compared with controlling the storage conditions of the storage equipment as a whole, controlling the storage conditions of each storage chamber is easier and simpler to achieve. Carrier cassettes that are used to carry substrates through a processing stage are stored as they are in the storage equipment. Any types of carrier cassettes are acceptable to the present invention.

The gas supply unit may have a gas source, piping for connecting the gas source to the storage chambers, and gas supply valves arranged for the storage chambers, respectively, in the piping. The exhaust unit may have an exhaust port connected to the storage chambers and exhaust valves arranged for the storage chambers, respectively, between the storage chambers and the exhaust port.

The exhaust unit may be a vacuum unit for individually evacuating the storage chambers.

The vacuum unit surely reduces the concentration of impurity gas in the storage chambers to optimize the storage conditions of each storage chamber. Compared with evacuating the storage equipment as a whole, individually evacuating the storage chambers requires a smaller vacuum pump because each storage chamber has a small volume.

The vacuum unit may have the vacuum pump, piping for connecting the vacuum pump to the storage chambers, and exhaust valves arranged for the storage chambers, respectively, in the piping.

The gas supply unit may have a gas source, piping for connecting the gas source to the storage chambers, and gas supply valves arranged for the storage chambers, respectively, in the piping, when the vacuum unit has a vacuum pump, piping for connecting the vacuum pump to the storage chambers, and exhaust valves arranged for the storage chambers, respectively, in the piping.

The storage equipment may have a controller for individually opening and closing the gas supply valves and exhaust valves.

The storage equipment may have a controller for individually opening and closing the gas supply valves and exhaust valves repeatedly at specified intervals.

The storage equipment may have a unit for measuring pressure in each of the pods or storage chambers, so that the controller may individually open and close the gas supply valves and exhaust valves according to the measured pressure.

The controller is capable of optimizing the storage conditions of each pod or storage chamber.

When the controller repeatedly opens and closes the gas supply valves and exhaust valves at specified intervals, the pods or storage chambers are filled with inert gas at the intervals to restore clean storage conditions. This helps maintain required storage conditions for the pods or storage chambers for a long time. The valve opening and closing intervals may be controlled based on time to simplify the structure of the controller.

When the controller opens and closes the gas supply valves and exhaust valves according to pressure measured in the pods or storage chambers, the pressure of each pod or storage chamber is surely maintained within a required range. Even if the storage conditions of each pod or storage chamber temporally change, the pressure of the pod or storage chamber is always maintained within the range. Compared with the time-based control, the pressure-based control improves the reliability of maintenance of the storage conditions of each pod or storage chamber.

Still another aspect of the present invention provides a method of storing substrates, including the steps of carrying substrates set in a pod into storage equipment, fitting a removable cover to the pod to hermetically close the pod in the storage equipment, and controlling the storage conditions of each pod in the storage equipment.

This aspect controls the storage conditions of each pod that is holding substrates in the storage equipment. Compared with controlling the storage conditions of the storage equipment as a whole, controlling the storage conditions of each pod is easier to achieve. Taking a pod into or out of the storage equipment never influences the storage conditions of the other pods in the storage equipment. Pods that are used to carry substrates through a processing stage are stored as they are in the storage equipment. Accordingly, there is no need of specially preparing chambers for storing substrates in the storage equipment. This simplifies the structure of the storage equipment.

The controlling the storage conditions of each pod may continuously supply inert gas into the pod, or may continuously evacuate the pod, or may supply inert gas into the pod at specified intervals, or may evacuate the pod for a specified period at specified intervals, or may repeat, at specified intervals, evacuating the pod for a specified period and supplying inert gas into the pod for a specified period.

The controlling the storage conditions of each pod may repeat supplying and stopping inert gas into the pod according to pressure that is being monitored in the pod.

The controlling the storage conditions of each pod may repeat evacuating the pod, supplying inert gas into the pod, and stopping the inert gas, according to pressure that is being monitored in the pod.

This aspect individually evacuates and supplies inert gas into pods stored in the storage equipment, to control the storage conditions of substrates held in each pod. By continuously evacuating each pod or by continuously supplying inert gas into each pod, the aspect optimizes storage conditions for each pod.

By supplying inert gas into each pod at specified intervals or by evacuating each pod at specified intervals, the aspect restores clean storage conditions for each pod at the intervals, to maintain optimum storage conditions for each pod for a long time.

By repeating supplying inert gas into each pod and evacuating the pod according to pressure that is being monitored in the pod, the aspect surely maintains optimum storage conditions for the pod without regard to the history of wafers held in the pod or the degree of airtightness of the pod.

Still another aspect of the present invention provides a method of storing substrates including the steps of carrying substrates set in a carrier cassette into storage equipment, placing the carrier cassette in a storage chamber in the storage equipment, closing an opening of the storage chamber to form an airtight state in the storage chamber, and controlling the storage conditions of each storage chamber in the storage equipment.

This aspect stores substrates set in a carrier cassette into a storage chamber of the storage equipment and forms a closed state in the storage chamber. This aspect controls the storage conditions of each storage chamber in the storage equipment, and therefore, is easy to achieve compared with controlling the storage conditions of the storage equipment as a whole. Carrier cassettes that are used to carry substrates through a processing stage are stored as they are in the storage equipment. Any types of carrier cassettes are acceptable to this aspect of the present invention.

Taking a carrier cassette into or out of a storage chamber of the storage equipment never influences the storage conditions of the other storage chambers in the storage equipment.

The step of controlling the storage conditions of each storage chamber may continuously supply inert gas into the storage chamber, or may continuously evacuate the storage chamber, or may supply inert gas into the storage chamber at specified intervals, or may evacuate the storage chamber for a specified period at specified intervals, or may repeat, at specified intervals, evacuating the storage chamber for a specified period and supplying inert gas into the storage chamber for a specified period.

The step of controlling the storage conditions of each storage chamber may repeat supplying and stopping inert gas into the storage chamber according to pressure that is being monitored in the storage chamber. Instead, this step may repeat evacuating the storage chamber, supplying inert gas into the storage chamber, and stopping the inert gas, according to pressure that is being monitored in the storage chamber.

This aspect individually evacuates and supplies inert gas into the storage chambers of the storage equipment, to control the storage conditions of substrates held in each storage chamber. By continuously evacuating each storage chamber or by continuously supplying inert gas into each storage chamber, the aspect maintains optimum storage conditions for each storage chamber.

By supplying inert gas into each storage chamber at specified intervals or by evacuating each storage chamber at specified intervals, the aspect restores clean storage conditions for each storage chamber at the intervals, to maintain optimum storage conditions for each storage chamber for a long time.

By repeating supplying inert gas into each storage chamber and evacuating the storage chamber according to pressure that is being monitored in the storage chamber, the aspect surely maintains optimum storage conditions for the storage chamber without regard to the history of wafers held in the storage chamber or the degree of airtightness of the storage chamber.

DETAILED DESCRIPTION OF THE EMBODIMENTS

First Embodiment

FIGS. 1 to 10 show the first embodiment of the present invention.

The first embodiment provides storage equipment for semiconductor substrates or wafers. This storage equipment stores carrier cassettes called "pods" for holding and carrying wafers.

Figure 1:
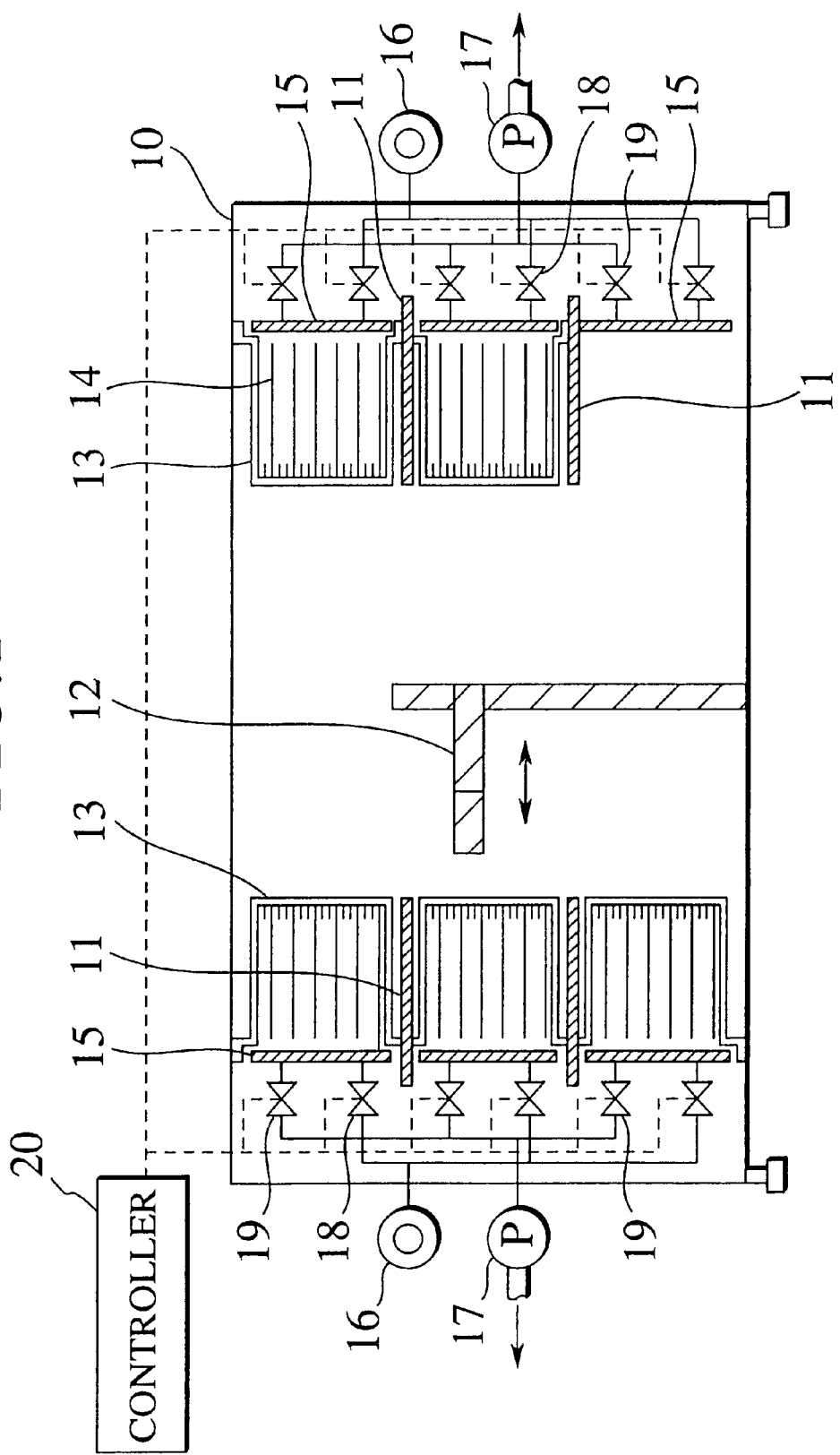
FIG. 1 is a sectional view showing storage equipment for semiconductor substrates according to a first embodiment of the present invention.
Figure 2:
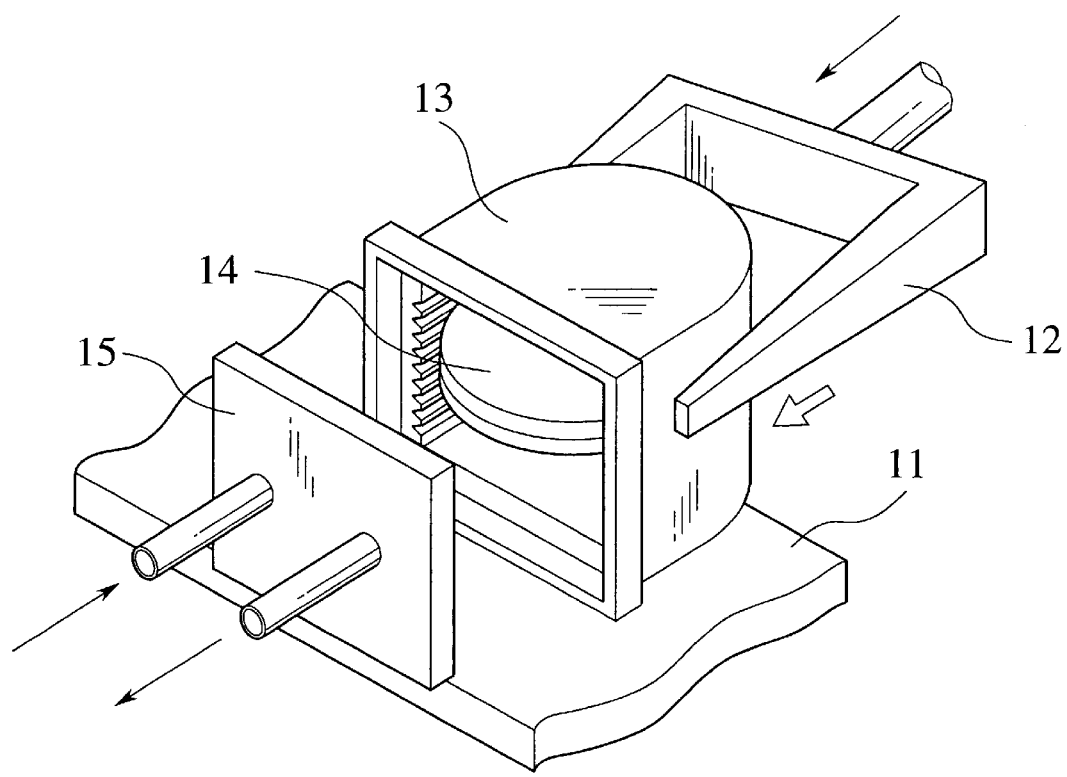
FIG. 2 is a perspective view showing a pod and a cover to be attached thereto according to the first embodiment.

FIG. 1 is a sectional view showing the storage equipment of the first embodiment, and FIG. 2 is a perspective view showing a pod to be stored in the storage equipment. The pod is a carrier cassette having an opening for taking in and out wafers. When the opening is closed with a cover, the cassette becomes airtight.

The pods will replace conventional open-type wafer cassettes, to handle large, fine wafers. When a pod is hermetically closed with a cover, wafers in the pod will never drop therefrom and no dust will contaminate the wafers.

The storage equipment has a cassette transfer tool 12 at the center thereof, to carry a pod. Shelves 11 are arranged on each side of the cassette transfer tool 12. At far part of the shelves, covers for pods are arranged.

The pod 13 holding wafers 14 is carried by the cassette transfer tool 12 to a given shelf 11 and is fitted to the cover 15 that is attached to the storage equipment.

The cover 15 has at least two pipes, one being connected to a vacuum pump 17 and the other to a gas source 16.

The pipes of the cover 15 are provided with a gas supply valve 18 and an exhaust valve 19, respectively. These valves are opened and closed by a controller 20 that is electrically connected to the valves.

Figure 3A:
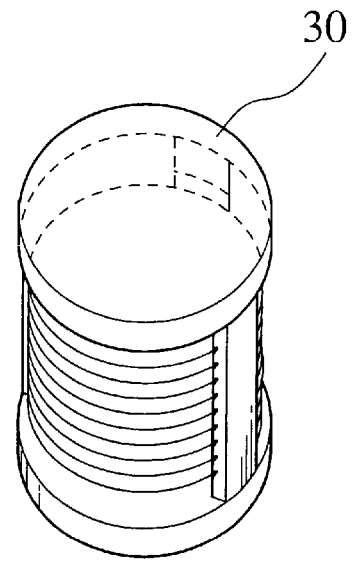
FIG. 3A is a perspective view showing an open wafer cassette to be stored in the pod.
Figure 3B:
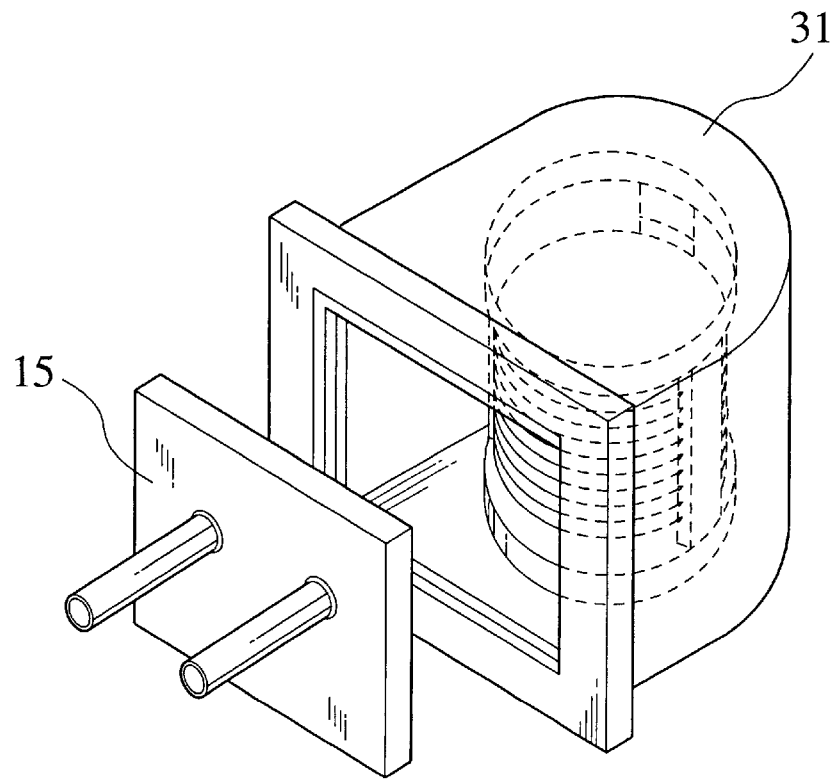
FIG. 3B is a perspective view showing another pod according to the first embodiment.

FIGS. 3A and 3B show another example of a pod. Pods employed by the present invention are not limited to the one shown in FIG. 2 having inner grooves for directly holding wafers. For example, the pod of FIGS. 3A and 3B is also acceptable to the present invention. In FIG. 3B, the pod accommodates an open-type wafer cassette 30 (FIG. 3A). Any types of pods are acceptable to the present invention, if the pods can be closed with the covers 15.

Figure 4:
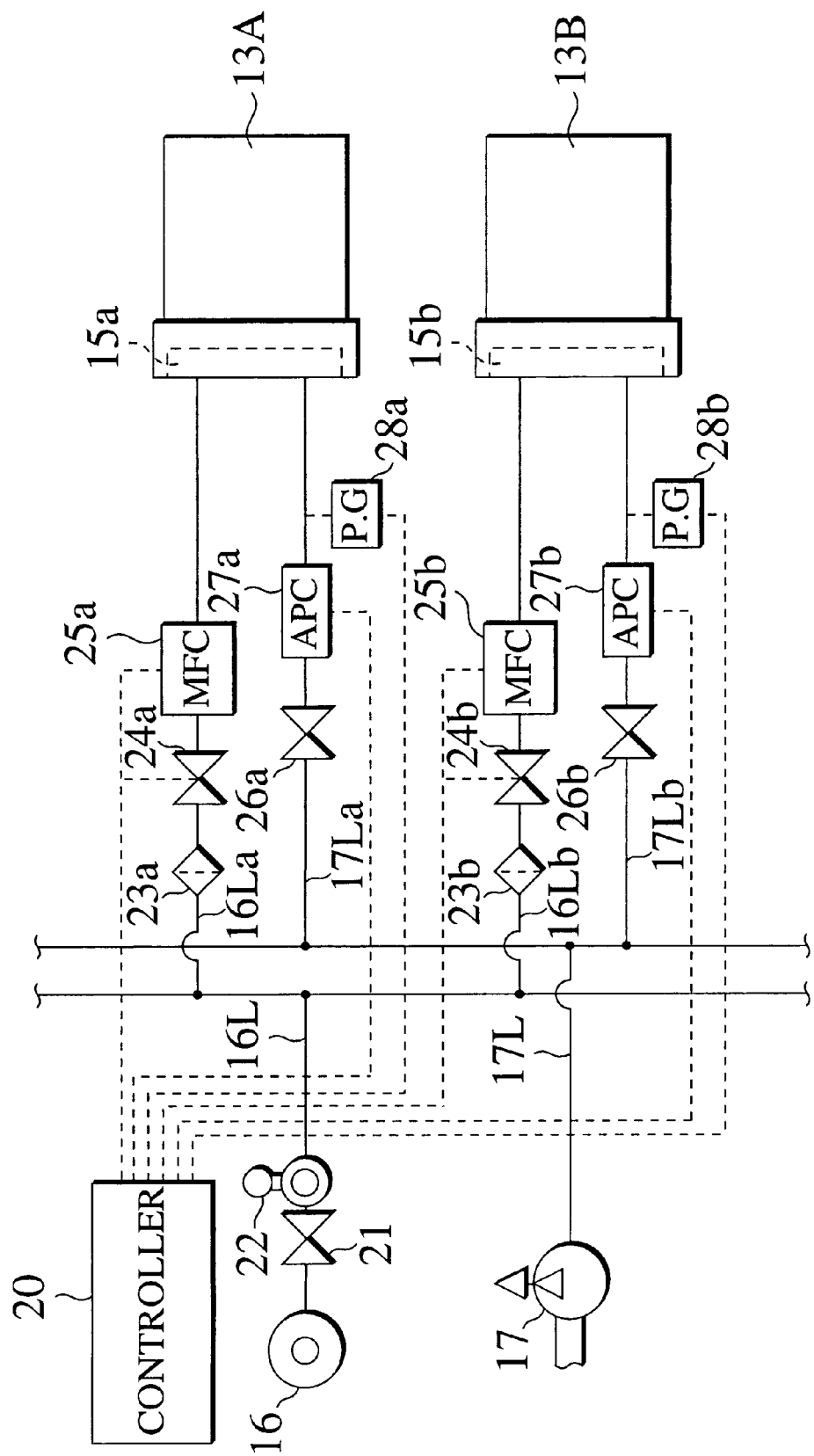
FIG. 4 shows the details of the storage equipment of the first embodiment.

FIG. 4 shows the details of the storage equipment of FIG. 1. Although two pods are shown in FIG. 4 for the sake of simplicity, the storage equipment can store an optional number of pods.

The vacuum pump 17, gas source 16, and controller 20 are arranged outside the storage equipment. A pipe 17L extends from the pump 17 and is branched into pipes 17La and 17Lb, which are connected to covers 15a and 15b, respectively.

The pipe 17La has a valve 26a and an automatic pressure controller 27a and is connected to the cover 15a. The pressure controller 27a corresponds to the exhaust valve 19 of FIG. 1. A pressure gauge 28a is arranged between the pressure controller 27a and the cover 15a.

The valve 26a is a source valve that is used when replacing the pressure controller 27a. The pressure controller 27a incorporates a pressure gauge, a controller, a variable vacuum exhaust valve, etc., to control an exhaust rate and maintain a predetermined pressure level. The pressure controller 27a is electrically connected to the controller 20, which controls the opening of the exhaust valve in the pressure controller 27a.

Similar to the pipe 17La, the pipe 17Lb has a valve 26b and an automatic pressure controller 27b and is connected to the cover 15b. A pressure gauge 28b is arranged between the pressure controller 27b and the cover 15b.

A pipe 16L extends from the gas source 16 and is provided with a main valve 21 and a regulator 22. When the storage equipment is used, the main valve 21 is opened, and an indication of the regulator 22 is used to determine the gauge pressure of gas to be supplied. The pipe 16L is branched into pipes 16La and 16Lb. The pipe 16La is provided with a filter 23a for removing dust from gas, a gas supply valve 24a, and a mass flow controller 25a and is connected to the cover 15a.

The flow controller 25a incorporates a flow rate controller and a valve whose opening is controlled by the flow rate controller. The flow controller 25a is electrically connected to the controller 20 and is controlled thereby. The gas supply valve 24a is used to stop the supply of gas and is, for example, an air valve that is driven by a solenoid. The gas supply valve 24a is controlled by the controller 20 independently of the flow controller 25a.

Gas supplied from the gas source 16 is inert gas such as nitrogen ($N_2$) gas or argon (Ar) gas of 5% humidity or below and 99.99% purity or above.

An atmosphere in a pod carried to a given position in the storage equipment and closed with the cover 15 is controlled by the flow controller (25a, 25b) and pressure controller (27a, 27b) under the control of the controller 20.

The storage conditions of each pod in the storage equipment are controlled by opening and closing the valves under the control of the controller 20. Storage methods achieved under the controller 20 will be explained in detail.

(1. First Storage Method Based on the First Embodiment)

A first storage method achieved under the controller 20 will be explained. The first storage method is characterized by repeating evacuating each pod and supplying gas into the pod at specified intervals.

Figure 5:
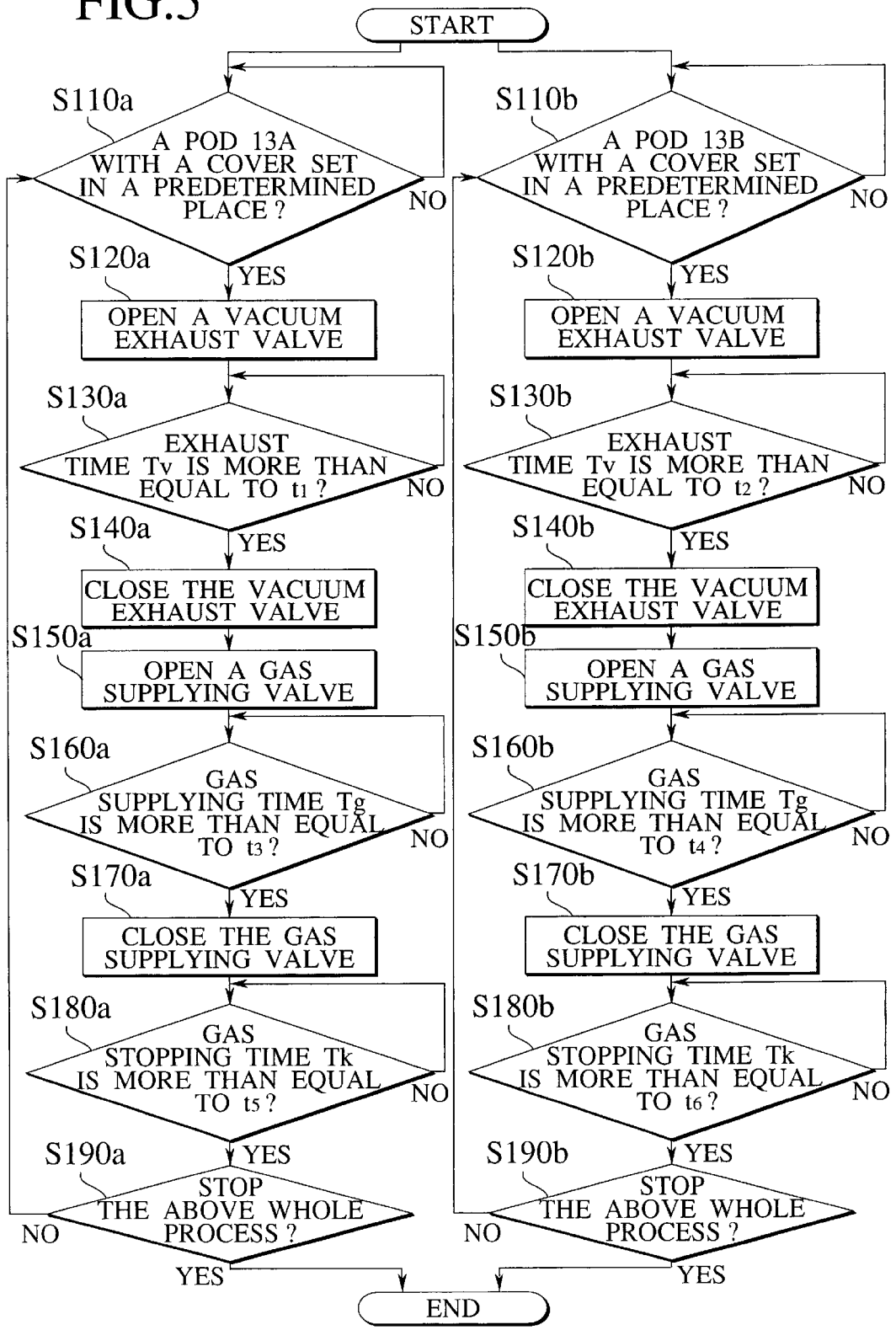
FIG. 5 is a flowchart showing a first storing method based on the first embodiment.

FIG. 5 is a flowchart showing the first storage method. The left part of the flowchart shows a control sequence applied to the pod 13A of FIG. 4, and the right part thereof shows a control sequence applied to the pod 13B. The control sequence on the pod 13A will be explained.

The vacuum pump 17 is activated, the valve 21 of the gas source 16 is kept open, and the controller 20 is started.

In step S110a, the controller 20 checks to see if the pod 13A closed with the cover 15a is set at a predetermined position on a shelf in the storage equipment. If it is properly set, the controller 20 opens the exhaust valve of the pressure controller 27a in step S120a, to start evacuating the pod 13A. At the same time, the controller 20 starts an internal timer to count an exhaust time Tv.

In step S130a, the controller 20 checks to see if the exhaust time Tv is equal to or above a predetermined exhaust time t1. If Tv<t1, the evacuation is continued until Tv reaches t1. If Tv≧t1, at the next step S140a, it closes the exhaust valve.

The predetermined exhaust time t1 may be a time within which the degree of vacuum of the pod 13A drops below, for example, $10^2$ Pa under various conditions. In practice, the time t1 is determined according to the inner volume and airtightness of a pod, the exhaust rate of the pressure controller 27a, the number of wafers stored in the pod, the history of the wafers, etc.

In step S150a, the controller 20 opens the gas supply valve 24a and the valve in the flow controller 25a, to supply inert gas into the pod 13A at a flow rate regulated by the flow controller 25a. At the same time, the controller 20 starts the internal timer to count a gas supply time Tg.

In step S160a, the controller 20 checks to see if the gas supply time Tg is equal to or above a predetermined gas supply time t3. If Tg<t3, the gas is continuously supplied. If Tg≧t3, at the next step S170a, it closes the gas supply valve 24a and the valve in the flow controller 25a.

The predetermined gas supply time t3 is dependent on a target pressure of the pod, the internal volume of the pod, and a gas flow rate regulated by the flow controller 25a. If the target pressure is set to be slightly lower than atmospheric pressure, the airtightness of the pod closed with the cover will properly be maintained. An atmosphere in the pod 13A is replaced with the high-purity inert gas to decrease the concentration of water and impurity gas such as oxygen in the pod 13A.

When the gas supply valve 24a is closed, the controller 20 starts the internal timer to measure a gas stop time Tk. In step S180a, the controller 20 checks to see if Tk≧t5. Until the gas stop time Tk reaches the predetermined gas stop time t5, the pod 13A is kept as it is in the storage equipment without evacuation or gas supply.

If the airtightness of the pod 13A is proper and if the wafers in the pod 13A produce little gas, the predetermined gas stop time t5 may be long because deterioration in the storage conditions of the pod due to aging is small.

If the airtightness of the pod 13A is improper to easily accept outside air, the predetermined gas stop time t5 must be shorter. In this way, the predetermined gas stop time t5 is variable and may be several tens of minutes, several days, or several weeks depending on conditions.

If Tk≧t5 in step S180a, at the next step S190a, the controller 20 checks to see if the operation must be terminated. If not, the flow returns to step S110a.

Although the above explanation relates to the pod 13A, the controller 20 achieves the same control on the pod 13B independently. Steps S110b to S190b for the pod 13B correspond to steps S110a to S190a for the pod 13A. In consideration of the airtightness of the pod 13B and the history of wafers held in the pod 13B, a predetermined exhaust time t2 in step S130b, a predetermined gas supply time t4 in step S160b, and a predetermined gas stop time t6 in step S180b are determined.

Figure 6:
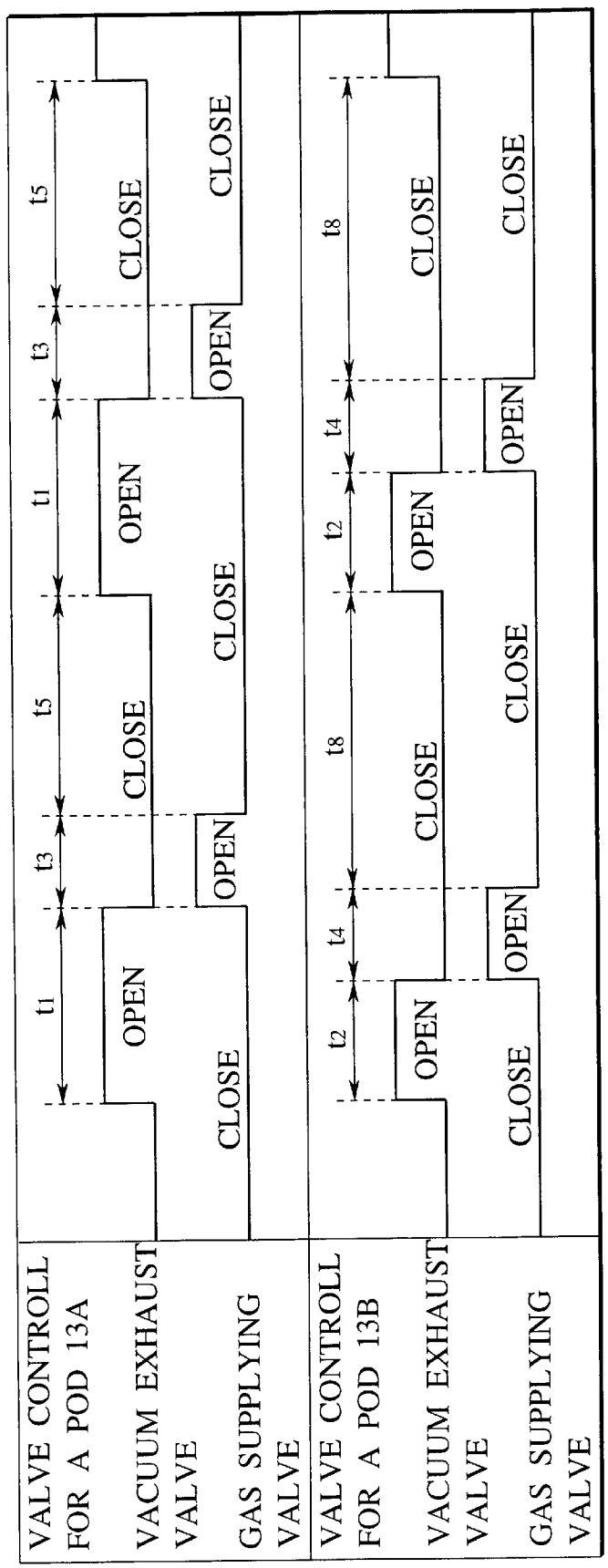
FIG. 6 shows valve operations according to the first storing method.

FIG. 6 shows the open and close intervals of the exhaust valves and gas supply valves of the pods 13A and 13B based on the control sequence of FIG. 5. The upper half of FIG. 6 is the pod 13A and the lower half thereof is the pod 13B.

In the upper half of FIG. 6, the exhaust valve of the pressure controller 27a is opened for the predetermined time t1 to evacuate the pod 13A and is closed. Then, the gas supply valve 24a is opened to supply gas for the predetermined time t3 through the flow controller 25a, and the valve 24a is closed. The valves 27a and 24a are kept closed for the predetermined time t5. Thereafter, the exhaust valve of the pressure controller 27a is again opened to evacuate the pod 13A for the predetermined time t1. These operations are repeated.

Similar valve operations are carried out on the pod 13B. The predetermined times t2, t4, and t6 for the pod 13B differ from the predetermined times t1, t3, and t5 for the pod 13A.

In this way, the first storage method hermetically closes each pod in the storage equipment of the first embodiment and controls the storage conditions of each pod. To control the storage conditions of each pod, the first storage method repeats evacuating the pod and supplying inert gas into the pod at specified intervals.

Evacuating the storage equipment as a whole needs a large vacuum pump as well as airtightness in the storage equipment as a whole. This leads to increase the cost of the equipment. On the other hand, the first storage method evacuates each pod with a small vacuum pump instead of evacuating the storage equipment itself. This suppresses the cost of the equipment.

The first storage method controls the storage conditions of wafers pod by pod in the storage equipment, and therefore, there is no need of preparing closed storage chambers in the storage equipment. This simplifies the internal structure of the storage equipment and reduces the cost thereof.

Even if there is a pod whose airtightness is poor to allow outside air to enter the pod, the first storage method repeatedly evacuates the pod and supplies inert gas into the pod, to optimize the storage conditions of the pod. Any pods available in the market are acceptable to the first storage method.

The first storage method hermetically closes each pod and controls the storage conditions of wafers pod by pod in the storage equipment. Even if the cassette transfer tool 12 carries a new pod into the storage equipment, it will never influence the storage conditions of the other pods in the equipment, unlike the clean stocker of the prior art. Even if pods in the storage equipment have different airtightness levels and hold wafers of different histories, the first storage method is capable of individually optimizing the storage conditions of the pods.

(2. Second Storage Method Based on the First Embodiment)

A second storage method is a simplified form of the first storage method. The second storage method involves no evacuation operation and repeatedly supplies inert gas into each pod at specified intervals.

Figure 7:
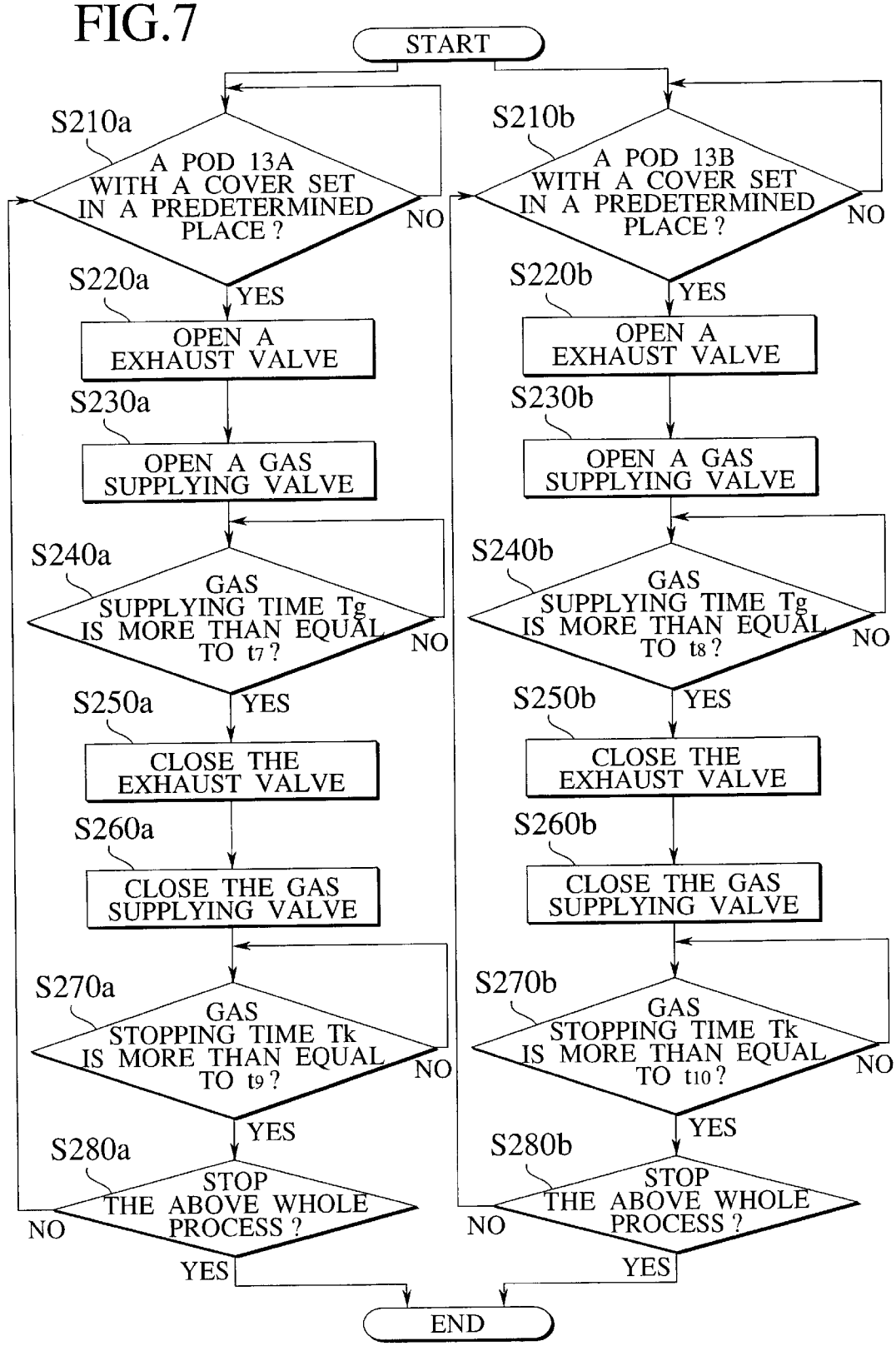
FIG. 7 is a flowchart showing a second storing method based on the first embodiment.

FIG. 7 is a flowchart showing the second storage method. The second storage method will be explained with reference to the storage equipment of FIG. 4 and the flowchart of FIG. 7.

The vacuum pump 17 of FIG. 4 is not necessary for the second storage method. The pipe 17La connected to the cover 15a serves as an exhaust port. The valves 26a and 26b serve as exhaust valves. The automatic pressure controllers 27a and 27b may be omitted.

In step S210a, the controller 20 checks to see if the pod 13A closed with the cover is set at a predetermined position in the storage equipment. If it is properly set, at the next step S220a, the controller 20 opens the exhaust valve 26a, and step S230a opens the gas supply valve 24a so that the flow controller 25a may supply gas at a given rate. The pod 13A is filled with inert gas such as $N_2$ of high purity. As soon as the gas supply valve 24a is opened, the controller 20 starts the internal timer to count a gas supply time Tg.

In step S240a, the controller 20 checks to see if the gas supply time Tg has reached a predetermined gas supply time t7. If not, the gas is continuously supplied until the predetermined time t7 elapses. If Tg>t7 in step S240a, it closes the exhaust valve 26a in step S250a and the gas supply valve 24a in step S260a.

As soon as the gas supply valve 24a is closed, the controller 20 starts the internal timer to count a gas stop time Tk. In step S270a, the controller 20 checks to see if the gas stop time Tk has reached a predetermined time t9. The pod 13A is kept as it is until the predetermined time t9 elapses. If Tk>t9 in step S270a, at the next step S280a, the controller 20 checks to see if the control sequence must be terminated. If not, the flow returns to step S210a.

A similar control sequence is carried out on the pod 13B, to open and close the exhaust valve 26b and gas supply valve 24b. Predetermined times t8 and t10 for the pod 13B may differ from the predetermined times t7 and t9 for the pod 13A.

Unlike the first storage method, the second storage method carries out no evacuation on each pod. Only by opening the exhaust valve (26a, 26b) of a pod and supplying inert gas into the pod for a given time, air initially contained in the pod is mostly replaced with $N_2$ gas of high purity. When the gas supply valve 24a is closed in step S260a, the pod 13A is filled with $N_2$ gas of high purity and the concentration of water and oxygen in the pod becomes greatly low compared with that when the pod has been carried into the storage equipment.

When the gas stop time Tk reaches the predetermined time t9, the second storage method again supplies the inert gas of high purity into the pod 13A to clean the pod. As a result, the storage conditions of the pod 13A are maintained above a required level without regard to the airtightness level of the pod or the history of wafers held in the pod.

The second storage method closes the exhaust valve 26a in step S250a before stopping the gas supply valve 24a in step S260a. As a result, the internal pressure of the pod 13A is slightly higher than atmospheric pressure. Setting the pressure of a pod slightly higher than atmospheric pressure prevents outside air from entering the pod due to the pressure difference.

Figure 8:
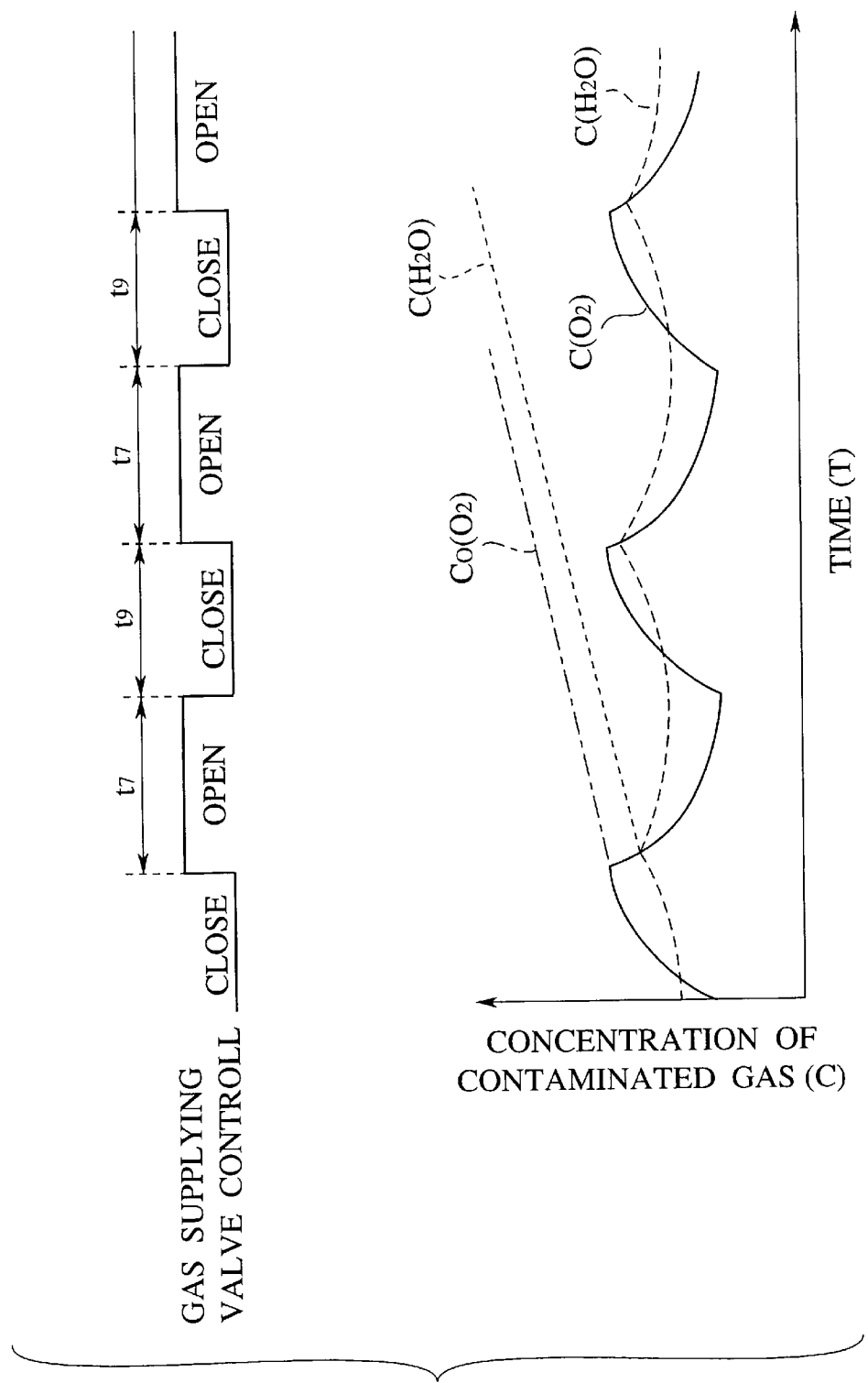
FIG. 8 shows temporal changes in the concentration of impurity gas according to the second storing method.

FIG. 8 shows examples of temporal changes in the concentration of impurity gas in a pod. The impurity gas is $H_2O$ and $O_2$ to cause oxidation contamination on wafers. An ordinate has a logarithm scale and represents the concentration (C) of impurity gas in a pod, and an abscissa represents a storage time (T) of the pod.

A dot-and-dash line $Co(O_2)$ represents oxygen concentration and a doted line $Co(H_2O)$ water concentration both measured in a closed-type pod available in the market after filling the pod with $N_2$ gas and leaving the pod as it is.

Generally, pods available in the market are imperfect in airtightness, and therefore, outside impurity gas inevitably enters the pods as time passes. As a result, oxygen concentration and water concentration in the pods rise as time passes even if the pods are closed with covers. According to actual measurement, oxygen concentration in pods was less than 1 ppm just after the pods were filled with $N_2$ and deteriorated to about 10 ppm after about 30 minutes.

A continuous line $C(O_2)$ represents oxygen concentration and a dotted line $C(H_2O)$ water concentration both in a pod that is available in the market and is controlled according to the second storage method of the present invention. The upper half of FIG. 8 shows the opening and closing of the gas supply valve according to the second storage method.

The second storage method repeatedly opens and closes the gas supply valve at specified intervals (t7, t9) to decrease the concentration of impurity gas at the intervals. Namely, the second storage method is capable of keeping the concentration of impurity gas below a required level. For example, the gas supply time t7 is about 15 minutes and the gas stop time t9 is about 10 minutes. In this case, the concentration of oxygen in the pod is kept below 5 ppm.

Proper values for the gas supply time t7 and gas stop time t9 to keep the impurity concentration below a required level depend on the airtightness and internal volume of a given pod.

As explained above, the second storage method employs no vacuum pump and keeps proper storage conditions for each pod by repeatedly supplying gas into the pod. Namely, the second storage method omits the vacuum pump arranged outside the storage equipment of FIGS. 1 and 4, thereby simplifying the structure of the storage equipment and reducing the cost thereof.

The gas supply valve and exhaust valve of each pod may always be opened to continuously supply inert gas into the pod. This surely maintains impurity concentration in the pod below a reference level.

(3. Third Storage Method Based on the First Embodiment)

Figure 9:
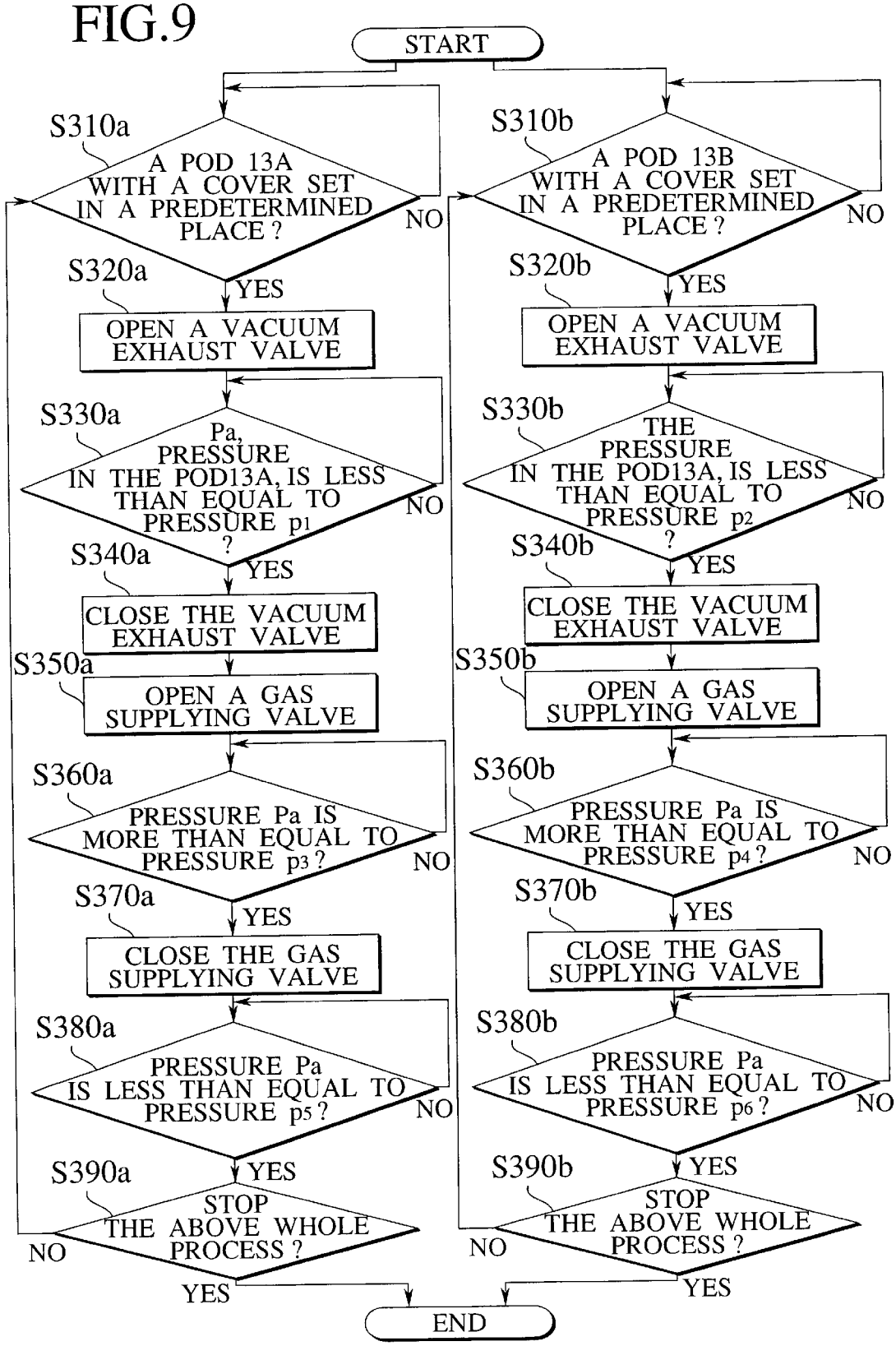
FIG. 9 is a flowchart showing a third storing method based on the first embodiment.

FIG. 9 is a flowchart showing a third storage method achieved by the controller 20 in the storage equipment of the first embodiment. What is different from the first storage method is that the third storage method opens and closes valves according to pressure instead of time. The third storage method achieved on the pod 13A of FIG. 4 will be explained with reference to the flowchart of FIG. 9.

In step S310a, the controller 20 checks to see if the pod 13A closed with a cover is set at a predetermined position in the storage equipment. If it is properly set, at the next step s320a it opens the exhaust valve of the pressure controller 27a to evacuate the pod 13A.

In step S330a checks to see if a pressure Pa in the pod 13A is below a predetermined pressure p1. The pressure Pa in the pod 13A is measured with the pressure gauge 28a. If Pa≦p1, at the next step S340a the controller 20 closes the exhaust valve of the pressure controller 27a. The predetermined pressure p1 is, for example, 1 torr.

In step S350a, the controller 20 opens the gas supply valve 24a to supply inert gas of high purity into the pod 13A.

In step S360a, the controller 20 checks to see if the pressure Pa in the pod 13A has reached a predetermined pressure p3. If Pa≧p3, at the next step S370a, the controller 20 closes the gas supply valve 24a. The predetermined pressure p3 is, for example, slightly higher than atmospheric pressure.

The pressure Pa in the pod 13A gradually drops as gas therein gradually leaks. In step S380a, the controller 20 checks to see if the pressure Pa in the pod 13A drops to a predetermined pressure p5. If Pa≦p5, step S390a determines whether or not the control sequence must be terminated. If not, the flow returns to step S310a. The predetermined pressure p5 is, for example, equal to atmospheric pressure.

The third storage method is similarly carried out on the pod 13B through steps S310b to S390b.

Unlike the first storage method that opens and closes valves according to time, the third storage method opens and closes valves according to pressure in each pod. Even if the airtightness of a pod greatly fluctuates as time passes, the third storage method flexibly copes with such fluctuation and secures constant pressure in the pod.

(4. Fourth Storage Method Based on the First Embodiment)

Figure 10:
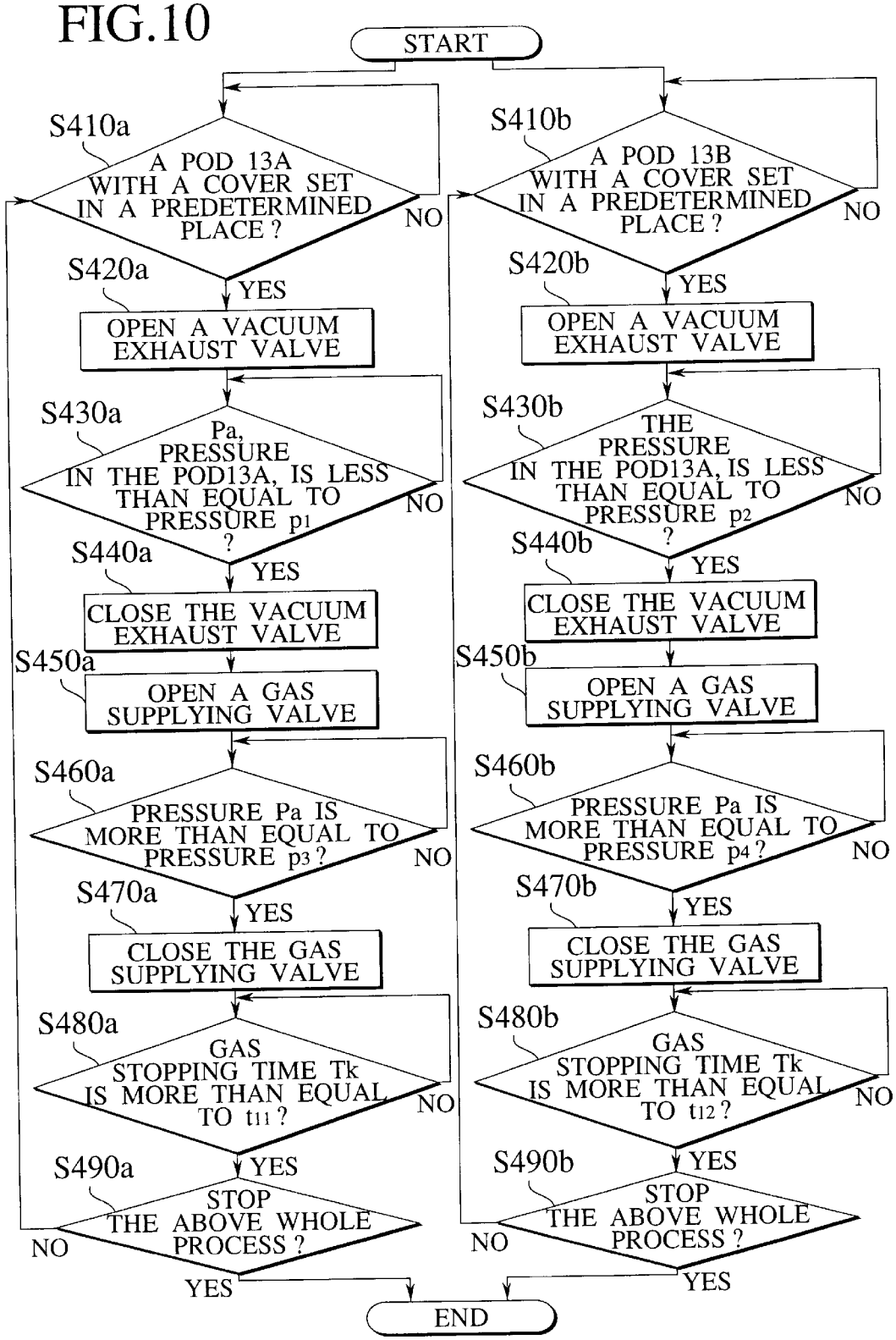
FIG. 10 is a flowchart showing a fourth storing method based on the first embodiment.

FIG. 10 is a flowchart showing a fourth storage method achieved by the controller 20 in the storage equipment of the first embodiment.

The fourth storage method opens and closes valves according to both pressure and time. Steps S410a to S480a are basically the same as steps S310a to S380a of the third storage method.

The fourth storage method is characterized in that the controller 20 closes the gas supply valve 24a and starts to count a gas stop time Tk with the internal timer of the controller 20 in step S470a. In step S480a the controller checks to see if the time Tk has reached a predetermined time t11. If Tk≧t11, at the next step S490a, the controller 20 determines whether or not the control sequence must be terminated. If not, the flow returns to step S410a.

Opening and closing valves according to time measured by timer is simpler than opening and closing them according to pressure measured by pressure gauge. Therefore, by partly judging the valve opening and closing timing according to time, the valve control becomes simpler compared with controlling the timing according to pressure only.

Valve operations to be controlled according to time or pressure are optionally determined.

The first to fourth storage methods achieved on the storage equipment of the first embodiment do not restrict the present invention. Although the first to fourth storage methods intermittently evacuate and supply inert gas into pods, the present invention may continuously evacuate pods or continuously supply inert gas into pods.

Second Embodiment

Figure 11:
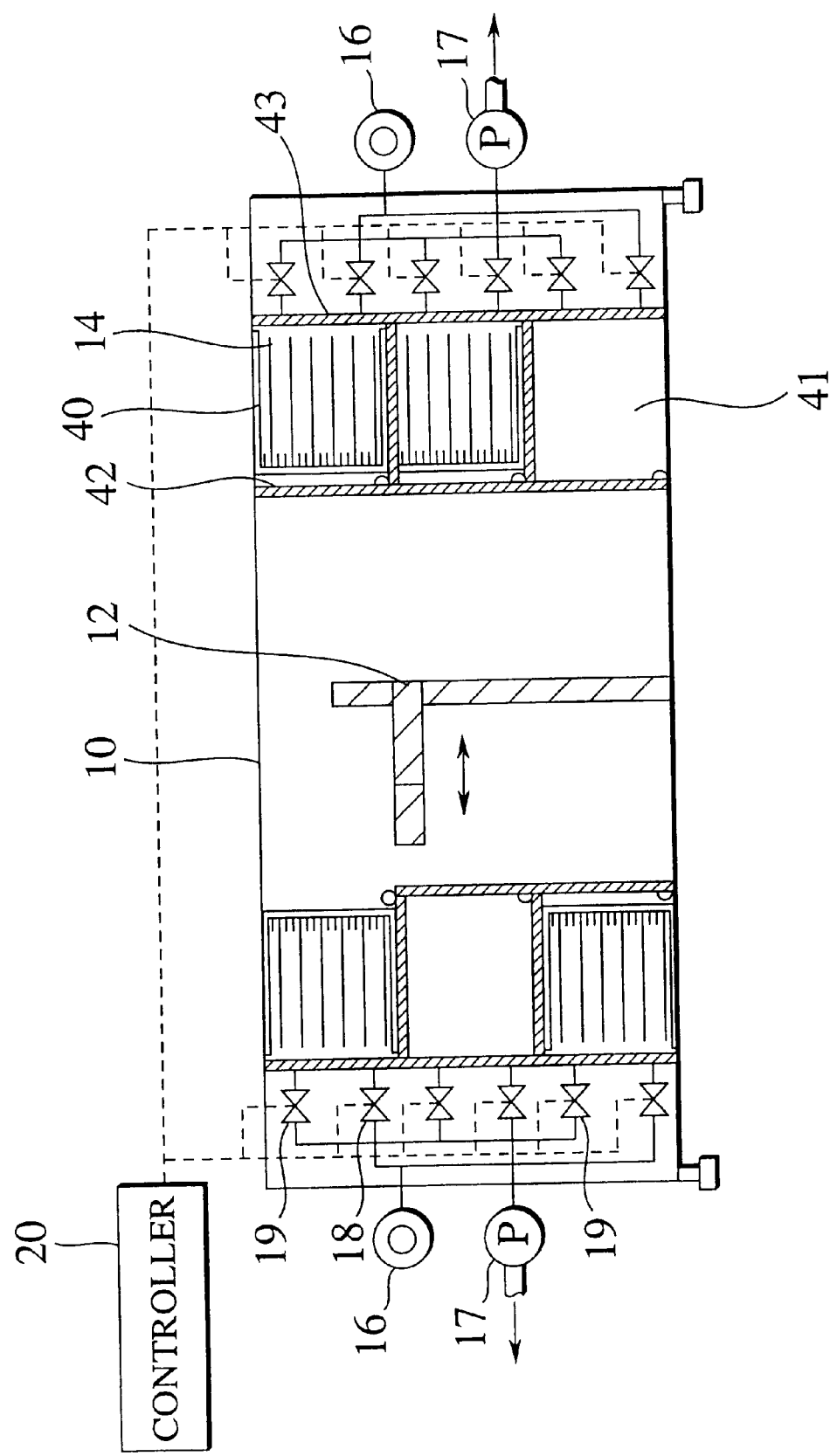
FIG. 11 is a sectional view showing storage equipment for semiconductor substrates according to a second embodiment of the present invention.

FIG. 11 is a sectional view showing storage equipment for storing wafers according to a second embodiment of the present invention. Unlike the first embodiment that forms an airtight state pod by pod in storage equipment, the second embodiment forms an airtight state chamber by chamber in storage equipment. The storage equipment of the second embodiment has storage chambers 41 for accommodating cassettes each holding wafers. Any types of wafer cassettes are acceptable to the second embodiment.

In FIG. 11, the storage equipment has a cassette transfer tool 12 at the center thereof, for carrying a wafer cassette. The storage chambers 41 are formed on each side of the cassette transfer tool 12.

Each storage chamber 41 is sized to accommodate a wafer cassette 40 that holds wafers. The cassette 40 may be of a closed type or of an open type.

The storage chamber 41 has an opening for taking in and out the cassette 40. The opening is closed with a door 42 to form an airtight state in the chamber 41.

A vacuum pump 17, a gas source 16, and a controller 20 are arranged outside the storage equipment. A back wall 43 of the storage chamber 41 is provided with at least two pipes, one being connected to the vacuum pump 17 and the other to the gas source 16.

These pipes are provided with a gas flow rate control valve 18 and an exhaust valve 19, respectively. The valves are electrically connected to the controller 20.

The storage chamber 41 is closed airtight, and an evacuation operation and a gas supply operation are carried out on each storage chamber 41.

Figure 12A:
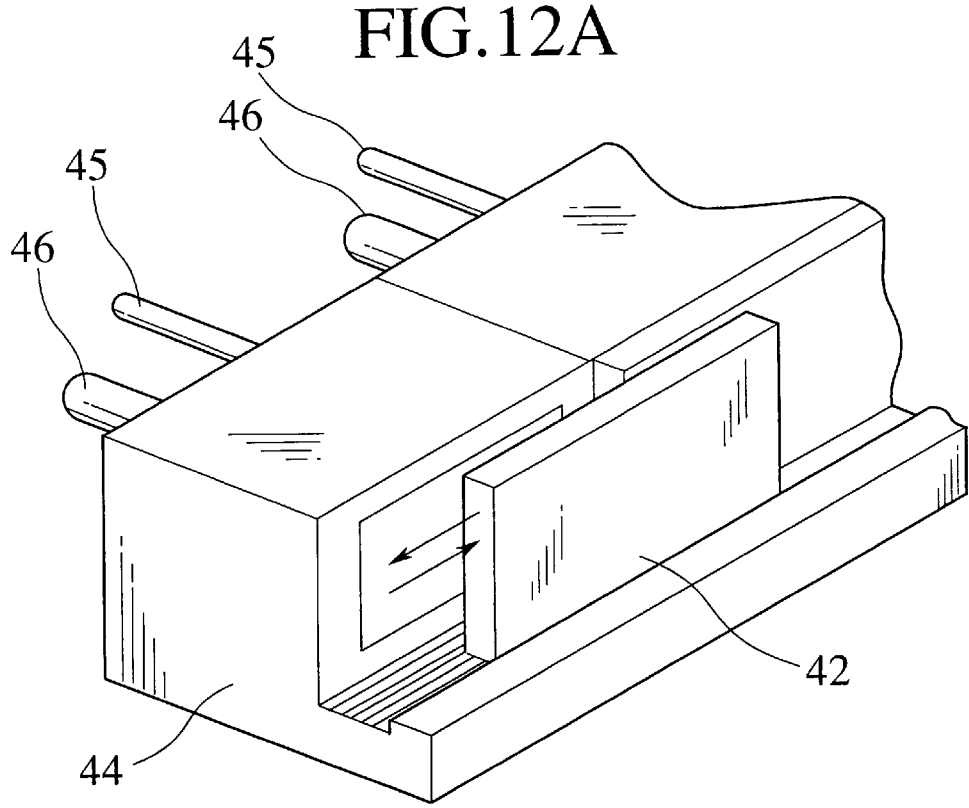
FIG. 12A is a perspective view showing a storage chamber of the second embodiment.
Figure 12B:
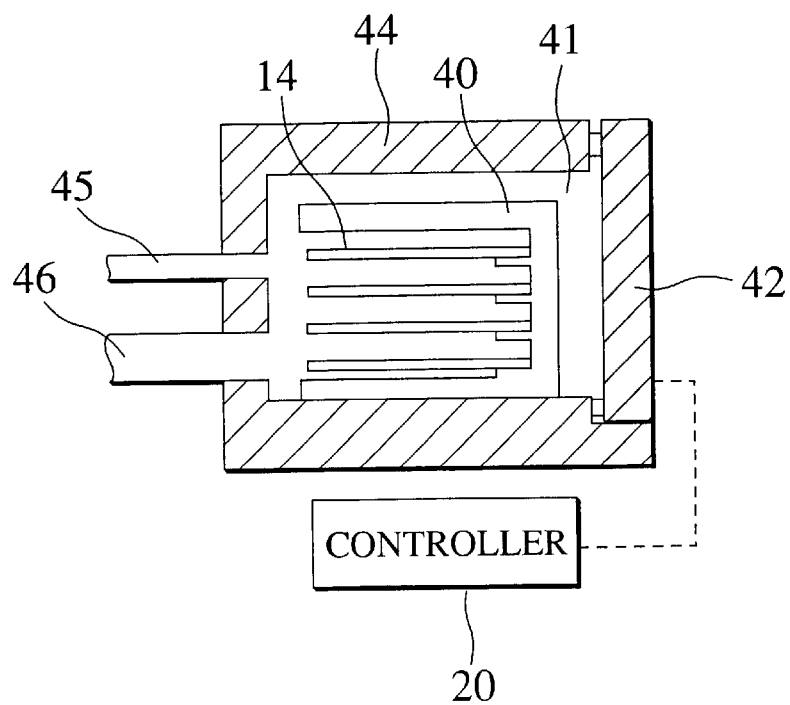
FIG. 12B is a sectional view showing the storage chamber of FIG. 12A.
Figure 13A:
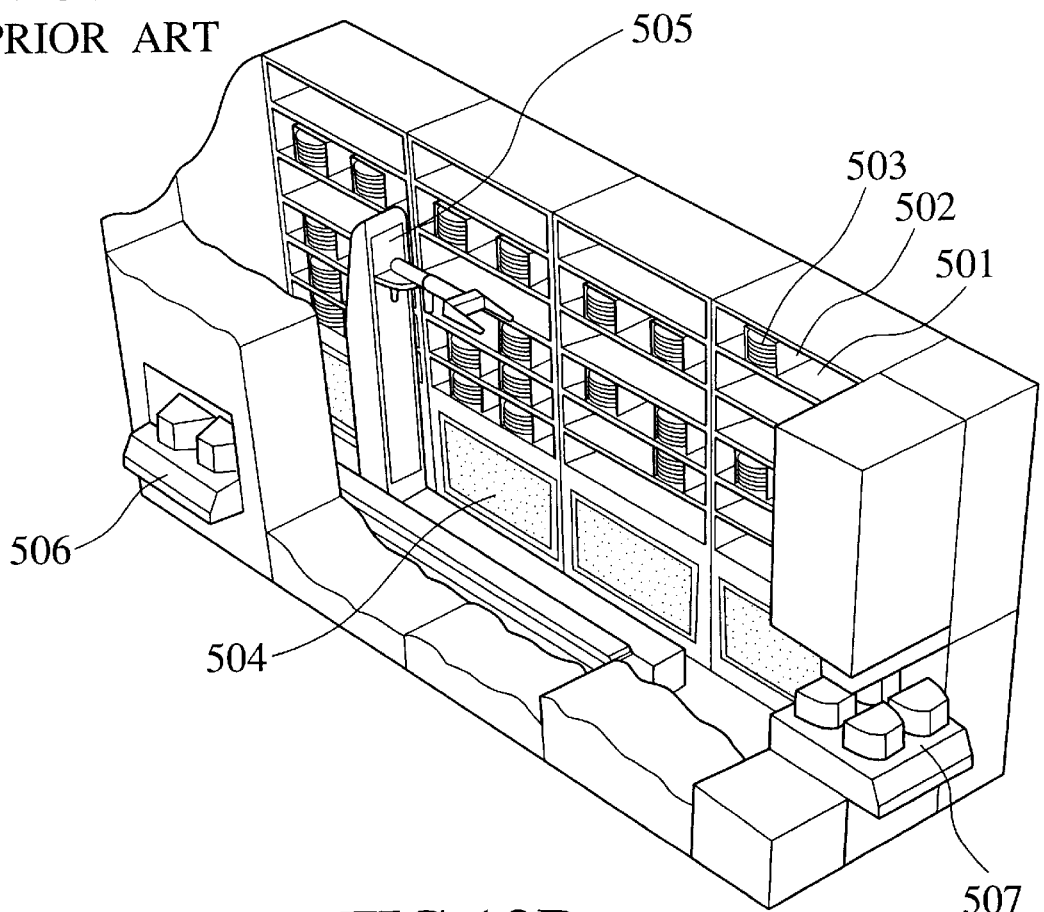
FIG. 13A is a perspective view showing storage equipment for substrates according to the prior art.
Figure 13B:
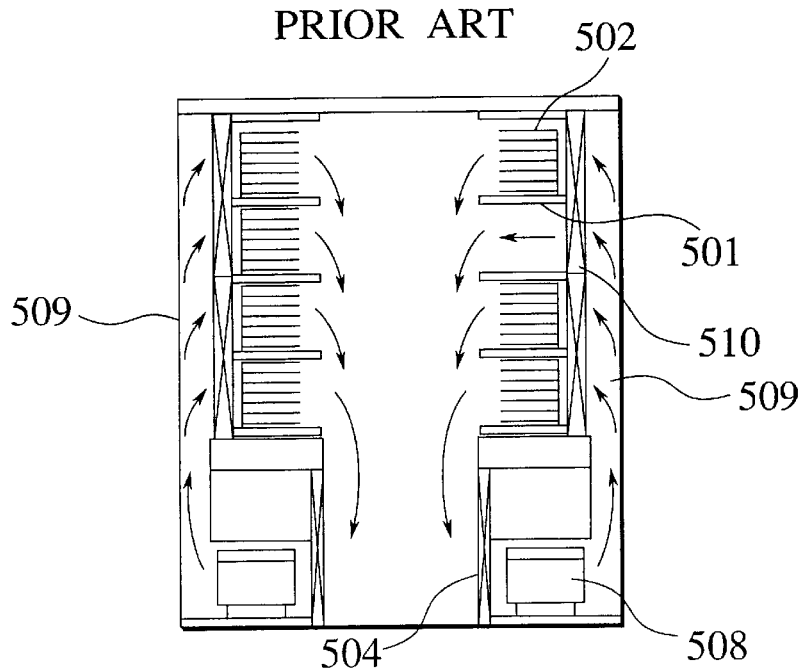
FIG. 13B is a sectional view showing the storage equipment of the prior art.

FIG. 12A is a perspective view showing the storage chamber 41, and FIG. 12B is a sectional view showing the same.

In FIG. 12A, the door 42 horizontally slides in front of the storage chamber 41. Instead, the door 42 may turn around a shaft arranged at a left or right edge of the opening of the storage chamber 41. The sliding door 42 is advantageous in reducing the size of the storage equipment because it needs a smaller space to open and close the opening of the storage chamber 41.

The cassette transfer tool 12 carries the cassette 40 that is holding wafers 14 into the storage chamber 41. The back wall 43 of the storage chamber 41 has the exhaust pipe 46 and gas supply pipe 45. A sliding part or a pivoting part of the door 42 is electrically connected to the controller 20 so that the door 42 is opened and closed by the controller 20.

The first to fourth storage methods achieved on the storage equipment of the first embodiment are achievable on the storage equipment of the second embodiment under the control of the controller 20 by replacing the pods of the first embodiment with the storage chambers 41 of the second embodiment.

The second embodiment controls the storage conditions of wafers chamber by chamber in the storage equipment.

Similar to the first embodiment, the second embodiment evacuates each storage chamber. There is no need of evacuating the whole of the storage equipment. Accordingly, the storage equipment of the second embodiment employs a small vacuum pump to reduce the cost of the storage equipment. The second embodiment optimizes storage conditions for each storage chamber according to the history of wafers held in the storage chamber.

The storage chamber 41 accommodates any type of wafer cassette. The storage chamber 41 may be sized to accommodate a single wafer cassette or a plurality of them.

In summary, the storage equipment according to the first embodiment may store pods that are holding wafers. In this case, each pod in the storage equipment is hermetically closed with a cover. The storage equipment according to the second embodiment may have storage chambers to receive wafers. In this case, each storage chamber is hermetically closed with a door.

The present invention provides each pod or storage chamber in the storage equipment with a gas supply unit and an exhaust unit, to control the storage conditions of the pods or storage chambers individually.

Compared with controlling the storage conditions of the storage equipment as a whole, controlling the storage conditions of each pod or storage chamber is easier and simpler to achieve because each pod or storage chamber has a small volume. As a result, the present invention helps reduce equipment and storage costs.

The present invention controls the storage conditions of wafers pod by pod, or chamber by chamber according to the history of the wafers and the conditions of the pods or storage chambers. The pods and storage chambers are hermetically closed, and therefore, they are free from the influence of the movement of the cassette transfer tool that carries a pod or storage chamber into and out of the storage equipment. This results in maintaining proper storage conditions in the storage equipment.

The present invention optimizes the storage conditions of wafers pod by pod, or chamber by chamber by continuously or periodically supplying inert gas into each pod or storage chamber, or by continuously or periodically evacuating each pod or storage chamber. Namely, the present invention continuously or periodically cleans the storage conditions of each pod or storage chamber in the storage equipment to maintain proper storage conditions for the pod or storage chamber for a long time even if the pod or storage chamber has poor airtightness.

The present invention is applicable not only to store silicon wafers but also to store various kinds of substrates such as exposure mask (reticle) substrates and liquid crystal glass substrates.

Various modifications will become possible for those skilled in the art after receiving the teachings of the present disclosure without departing from the scope thereof.

What is claimed is:

1. Storage equipment for substrates set in pods, comprising:

a storage-cabinet for at least two pods in which substrates are set;

a plurality of covers configured to individually cover the pods, said covers being located in the storage-cabinet;

means for fitting the covers to the pods, respectively;

means for holding the pods with the covers;

gas supply means for individually supplying gas into the pods through the covers; and exhaust means for individually discharging an atmosphere from the pods through the covers.

2. The storage equipment of claim 1, wherein the gas supply means has:

a gas source;

piping for connecting the gas source to the covers; and gas supply valves arranged for the pods, respectively, in the piping, and the exhaust means has:

an exhaust port connected to the covers; and exhaust valves arranged for the covers, respectively, between the covers and the exhaust port.

3. The storage equipment of claim 1, wherein the exhaust means is vacuum means for individually evacuating the pods through the covers.

4. The storage equipment of claim 3, wherein the vacuum means has:

a vacuum pump;

piping for connecting the vacuum pump to the covers; and exhaust valves arranged for the pods, respectively, in the piping.

5. Storage equipment for substrates set in carrier cassettes, comprising:

a storage-cabinet;

at least two storage chambers for storing the carrier cassettes in the storage-cabinet;

means for individually opening and closing the storage chambers to take in and out the carrier cassettes;

gas supply means for individually supplying gas into the storage chambers; and exhaust means for individually discharging an atmosphere from the storage chambers.

6. The storage equipment of claim 5, wherein the gas supply means has:

a gas source;

piping for connecting the gas source to the storage chambers; and gas supply valves arranged for the storage chambers, respectively, in the piping, and the exhaust means has:

an exhaust port connected to the storage chambers; and exhaust valves arranged for the storage chambers, respectively, between the storage chambers and the exhaust port.

7. The storage equipment of claim 5, wherein the exhaust means is vacuum means for individually evacuating the storage chambers.

8. The storage equipment of claim 7, wherein the gas supply means has:

a gas source;

piping for connecting the gas source to the storage chambers; and gas supply valves arranged for the storage chambers, respectively, in the piping, and the vacuum means has:

a vacuum pump;

piping for connecting the vacuum pump to the storage chambers; and exhaust valves arranged for the storage chambers, respectively, in the piping.

9. The storage equipment of any one of claims 2, 4, 6, and 8, further comprising:
   a controller for individually opening and closing the gas supply valves and exhaust valves.

10. The storage equipment of any one of claims 2, 4, 6, and 8, further comprising:
    a controller for individually opening and closing the gas supply valves and exhaust valves repeatedly at specified time intervals.

11. The storage equipment of any one of claims 2 and 4, further comprising:
    a controller for controlling the gas supply valves and exhaust valves; and
    pressure measuring means for measuring pressure in each of the pods so that the controller may individually open and close the gas supply valves and exhaust valves according to the measured pressure.

12. The storage equipment of any one of claims 6 and 8, further comprising:
    a controller for controlling the gas supply valves and exhaust valves; and
    pressure measuring means for measuring pressure in each of the storage chambers so that the controller may individually open and close the gas supply valves and exhaust valves according to the measured pressure.

13. A method of storing substrates comprising the steps of:
    carrying at least one pod, in which substrates are set, into a storage-cabinet;
    fitting a removable cover to each pod to hermetically close the pod in the storage-cabinet; and
    controlling the storage conditions of each pod in the storage cabinet.

14. The method of claim 13, wherein the controlling the storage conditions of each pod is continuously supplying inert gas into each pod in the storage cabinet.

15. The method of claim 13, wherein the controlling the storage conditions of each pod is continuously evacuating each pod in the storage cabinet.

16. The method of claim 13, wherein the controlling the storage conditions of each pod is supplying inert gas into each pod in the storage cabinet at specified time interval.

17. The method of claim 13, wherein the controlling the storage conditions of each pod is evacuating each pod in the storage cabinet for a specified period at specified time interval.

18. The method of claim 13, wherein the controlling the storage conditions of each pod is repeatedly at specified time intervals, evacuating each pod in the storage cabinet for a specified period and supplying inert gas into the pod for a specified period.

19. The method of claim 13, wherein the controlling the storage conditions of each pod is repeatedly supplying and stopping inert gas into each pod in the storage cabinet according to pressure that is being monitored in the pod.

20. The method of claim 13, wherein the controlling the storage conditions of each pod is repeatedly evacuating each pod in the storage cabinet, supplying inert gas into the pod, and stopping the inert gas, according to pressure that is being monitored in the pod.

21. A method of storing substrates comprising the steps of:
    carrying at least one carrier cassette, in which substrates are set, into a storage-cabinet;
    placing each carrier cassette in a storage chamber in the storage-cabinet;
    closing an opening of each storage chamber to form an airtight state in the storage chamber; and
    controlling the storage conditions of each storage chamber in the storage-cabinet.

22. The method of claim 21, wherein the controlling the storage conditions of each storage chamber is continuously supplying inert gas into each storage chamber in the storage cabinet.

23. The method of claim 21, wherein the controlling the storage conditions of each storage chamber is continuously evacuating each storage chamber in the storage cabinet.

24. The method of claim 21, wherein the controlling the storage conditions of each storage chamber is supplying inert gas into each storage chamber in the storage cabinet at specified intervals.

25. The method of claim 21, wherein the controlling the storage conditions of each storage chamber is evacuating each storage chamber in the storage cabinet for a specified period at specified intervals.

26. The method of claim 21, wherein the controlling the storage conditions of each storage chamber is repeatedly, at specified intervals, evacuating each storage chamber in the storage cabinet for a specified period and supplying inert gas into the storage chamber for a specified period.

27. The method of claim 21, wherein the controlling the storage conditions of each storage chamber is repeatedly supplying and stopping inert gas into each storage chamber in the storage cabinet according to pressure that is being monitored in the storage chamber.

28. The method of claim 21, wherein the controlling the storage conditions of each storage chamber is repeatedly evacuating each storage chamber in the storage cabinet, supplying inert gas into the storage chamber, and stopping the inert gas, according to pressure that is being monitored in the storage chamber.

* * * * *